(12) United States Patent
Osaki et al.

(10) Patent No.: US 6,564,362 B2
(45) Date of Patent: May 13, 2003

(54) METHOD OF DESIGNING A LAYOUT OF AN LSI CHIP, AND A COMPUTER PRODUCT

(75) Inventors: Seiko Osaki, Kawasaki (JP); Koji Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/789,490

(22) Filed: Feb. 22, 2001

(65) Prior Publication Data

US 2002/0004929 A1 Jan. 10, 2002

(30) Foreign Application Priority Data

Jul. 4, 2000 (JP) .................................. 2000-202479

(51) Int. Cl.[7] .............................................. G06F 17/50
(52) U.S. Cl. ............................................. 716/10; 716/8
(58) Field of Search ........................................ 716/1–14

(56) References Cited

U.S. PATENT DOCUMENTS

| | | | | | |
|---|---|---|---|---|---|
| 4,967,142 A | * | 10/1990 | Sauerwald et al. | ......... | 324/73.1 |
| 5,109,190 A | * | 4/1992 | Sakashita et al. | .......... | 324/73.1 |
| 5,254,942 A | * | 10/1993 | D'Souza et al. | ............ | 324/73.1 |
| 5,410,491 A | * | 4/1995 | Minami | ........................ | 703/19 |
| 5,428,624 A | * | 6/1995 | Blair et al. | ............... | 324/158.1 |
| 5,477,545 A | * | 12/1995 | Huang | ..................... | 324/158.1 |
| 5,838,580 A | * | 11/1998 | Srivatsa | .......................... | 716/8 |
| 6,145,116 A | * | 11/2000 | Tawada | ......................... | 716/10 |
| 6,198,978 B1 | * | 3/2001 | Takahashi | .................... | 700/117 |
| 6,314,547 B1 | * | 11/2001 | Donath et al. | ................. | 438/10 |
| 6,389,565 B2 | * | 5/2002 | Ryan et al. | .................. | 345/100 |

* cited by examiner

*Primary Examiner*—Vuthe Siek
*Assistant Examiner*—Sun James Lin
(74) *Attorney, Agent, or Firm*—Staas & Halsey LLP

(57) ABSTRACT

In a method of designing a layout of an LSI chip, which LSI chip has boundary scan registers, after arranging I/O cells and before arranging an internal logic circuit and the like, I/O connection boundary scan registers are preferentially arranged in empty regions of the I/O cells. Output I/O control boundary scan registers are arranged at intermediate points between the I/O connection boundary scan registers, respectively, or a chip side closer to the intermediate points. Thereafter, before arranging cells constituting other circuits and creating a wiring pattern, buffer cells are inserted into nets of test signals to the boundary scan register led to a test control circuit.

10 Claims, 13 Drawing Sheets

METHOD OF DESIGNING A LAYOUT OF AN LSI CHIP, AND A COMPUTER PRODUCT

FIELD OF THE INVENTION

The present invention in general relates to a method of designing a layout of an LSI chip having boundary scan registers. More particularly, this invention relates to a method of automatically arranging boundary scan registers and automatically making a fan-out adjustment.

BACKGROUND OF THE INVENTION

To design the layout of an LSI chip having boundary scan registers, it is conventionally required to arrange many boundary scan registers connected to I/O cells so that the nets of test signals to the boundary scan registers do not cross one another to prevent operation failure caused by the backflow of test signals or the like from occurring.

In addition, to prevent the occurrence of over-capacity and timing errors after providing wirings, it is required to make such a fan-out arrangement before providing the wirings that the capacity does not exceed output terminal driving capability in the connection between a test control circuit and the boundary scan registers. In the fan-out arrangement, it is necessary to arrange a minimum number of buffer cells at optimum positions with a view of reducing an LSI area and wiring jam.

The arrangement of the boundary scan registers is automatically made using a commercially available test circuit synthetic tool. According to this tool, the boundary scan registers are arranged to be attracted to the cells of an internal logic circuit of the LSI. With respect to the fan-out arrangement, according to the above-stated tool, such excessive fan-out as not to cause over-capacity and timing errors is determined and a fan-out arrangement is uniformly made based on the determined excessive fan-out.

FIG. 1 is a typical view of the result of the automatic arrangement of boundary scan registers using a conventional test circuit synthetic tool. In FIG. 1, legend 1 denotes an entire LSI, legend 11 denotes an I/O region, a hollow rectangle provided with legend 12 denotes an I/O connection boundary scan register connected to an I/O cell, and a hollow rhombi provided with legend 13 denotes an output I/O control boundary scan register connected to the I/O connection boundary scan register 12.

According to the conventional boundary scan register arrangement method stated above, the I/O connection boundary registers 12 are so arranged as to be attracted to the cells of the internal logic circuit. Due to this, as shown in FIG. 1, the I/O connection boundary scan registers 12 are dispersed on the entire LSI 1 and arranged irrespectively of the flow of test signals. As a result, the nets of test signals to the boundary scan registers cross one another, which disadvantageously causes operation failure due to the backflow or test signals or the like.

Moreover, according to the conventional fan-out adjustment method stated above, since the excessive fan-out is set, excessive buffers are inserted. This disadvantageously causes the increase of the LSI area and the increase of wiring jam.

SUMMARY OF THE INVENTION

It is an object of the present invention to provide a method of designing a layout of an LSI chip capable of automatically arranging boundary scan registers at appropriate positions and capable of making a fan-out adjustment between a test control circuit and the boundary scan registers by inserting a minimum number of buffers. It is another object of this invention to provide a computer readable recording medium that stores a computer program which when executed realizes the method according to the present invention.

The method of designing a layout of an LSI chip according to one aspect of this invention is characterized in that in designing a layout of an LSI chip having boundary scan registers, after arranging I/O cells and before arranging an internal logic circuit and the like, I/O connection boundary scan registers and output I/O control boundary scan registers are preferentially arranged in empty regions near the I/O cells and a fan-out adjustment is made by inserting buffer cells into nets of test signals to the boundary scan registers led to a test control circuit.

According to the above-mentioned aspect of this invention, since the I/O connection boundary scan registers are preferentially arranged after arranging the I/O cells, it is possible to arrange the I/O connection boundary scan registers in the vicinity of the I/O cells along the arrangement of the I/O cells.

In the above-mentioned aspect of this invention, the output I/O control boundary scan registers are arranged at the intermediate points between the I/O connection boundary scan registers, respectively. If the intermediate points are closer to the interior of the chip compared with positions at which the I/O connection boundary scan registers are arranged and have an adverse effect on the arrangement of the internal logic circuit or the like, then the output I/O control boundary scan registers are arranged toward the chip side closer to the intermediate points.

By doing so, the output I/O control boundary scan registers are arranged at the intermediate points between the I/O connection boundary scan registers, respectively. Thus, it is possible to prevent the arrangement of the output I/O control boundary scan registers from being deviated and to regularly arrange the nets between the boundary scan registers in a direction in which test signals flow. Further, if the intermediate points are located closer to the interior of the chip, the output I/O control boundary scan registers are arranged toward the chip side closer to the intermediate points. Thus, it is possible to prevent the boundary scan registers from hampering the arrangement of the internal logic circuit and the like provided in the chip.

Moreover, when making a fan-out adjustment, the wiring length between adjacent boundary scan registers is calculated based on the Manhattan lengths of the boundary scan registers, a wiring capacity is estimated based on the tentative wiring length and buffer cells are inserted into the nets of test signals based on the estimated wiring capacity. In addition, using a coefficient for correcting the difference between the tentative wiring length and an actual wiring length, the driving capabilities of the output terminals of the inserted buffer cells may be corrected. Besides, the positions at which the buffer cells are inserted are in the vicinity of the boundary scan register closest to the test control circuit among a group of boundary scan registers driven by the buffer cells.

By doing so, it is possible to estimate an actual wiring capacity and to determine a position at which the buffer cell is inserted based on the estimated wiring capacity. Due to this, before providing wirings, it is possible to make a fan-out adjustment with a minimum number of buffer cells. In addition, since the fan-out adjustment can be made in a condition far closer to that of actual wirings by using the correction coefficient, it is possible to prevent over-capacity after actually providing wirings more surely. Besides, since the buffer cells are arranged in the vicinity of the boundary scan register arranged closest to the test control circuit, it is possible to prevent timing errors or the like from occurring.

Other objects and features of this invention will become apparent from the following description with reference to the accompanying drawings.

DESCRIPTION OF THE PREFERRED EMBODIMENTS

Figure 1:
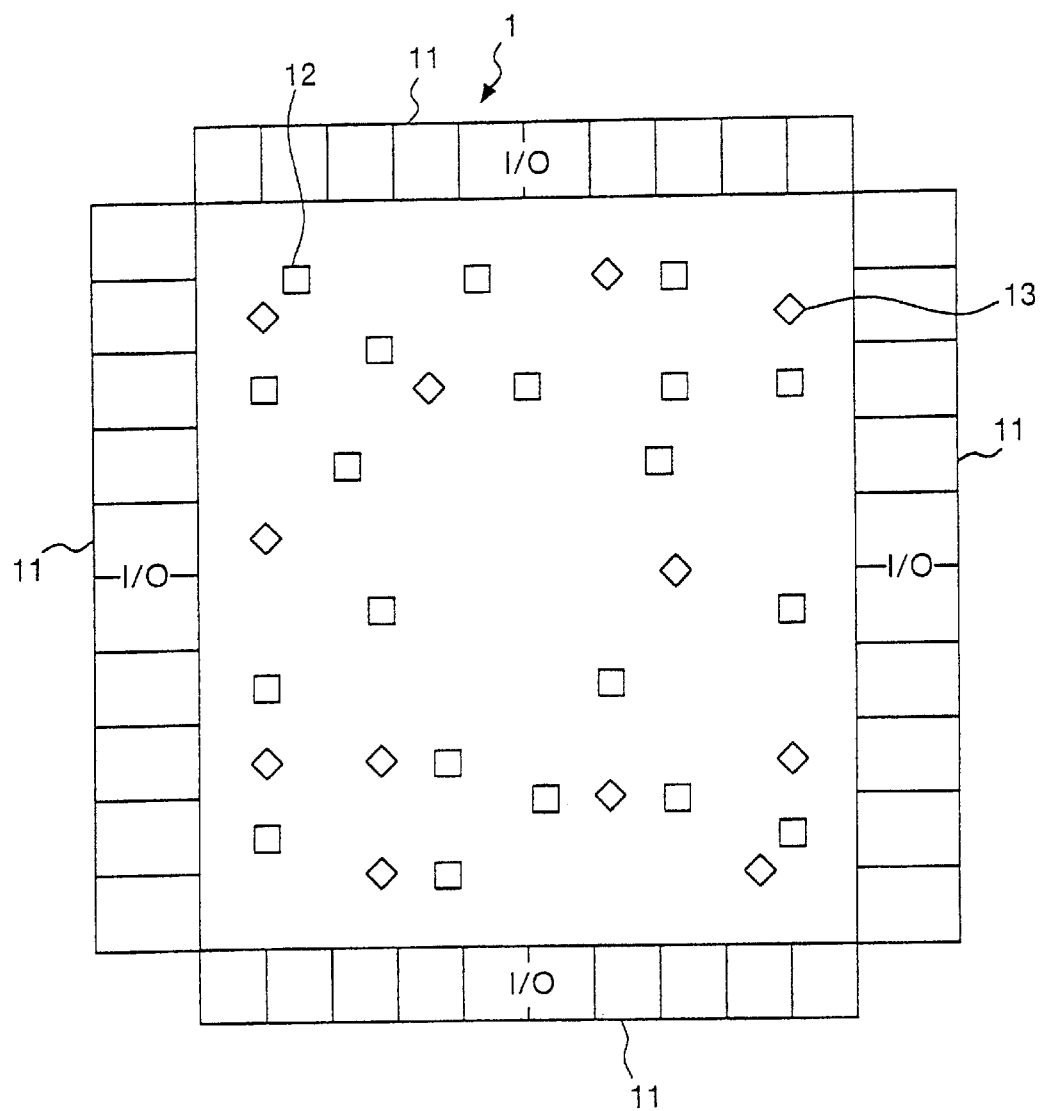
FIG. 1 is a view typically showing the result of automatic arrangement of boundary scan registers using a conventional test circuit synthetic tool.
Figure 2:
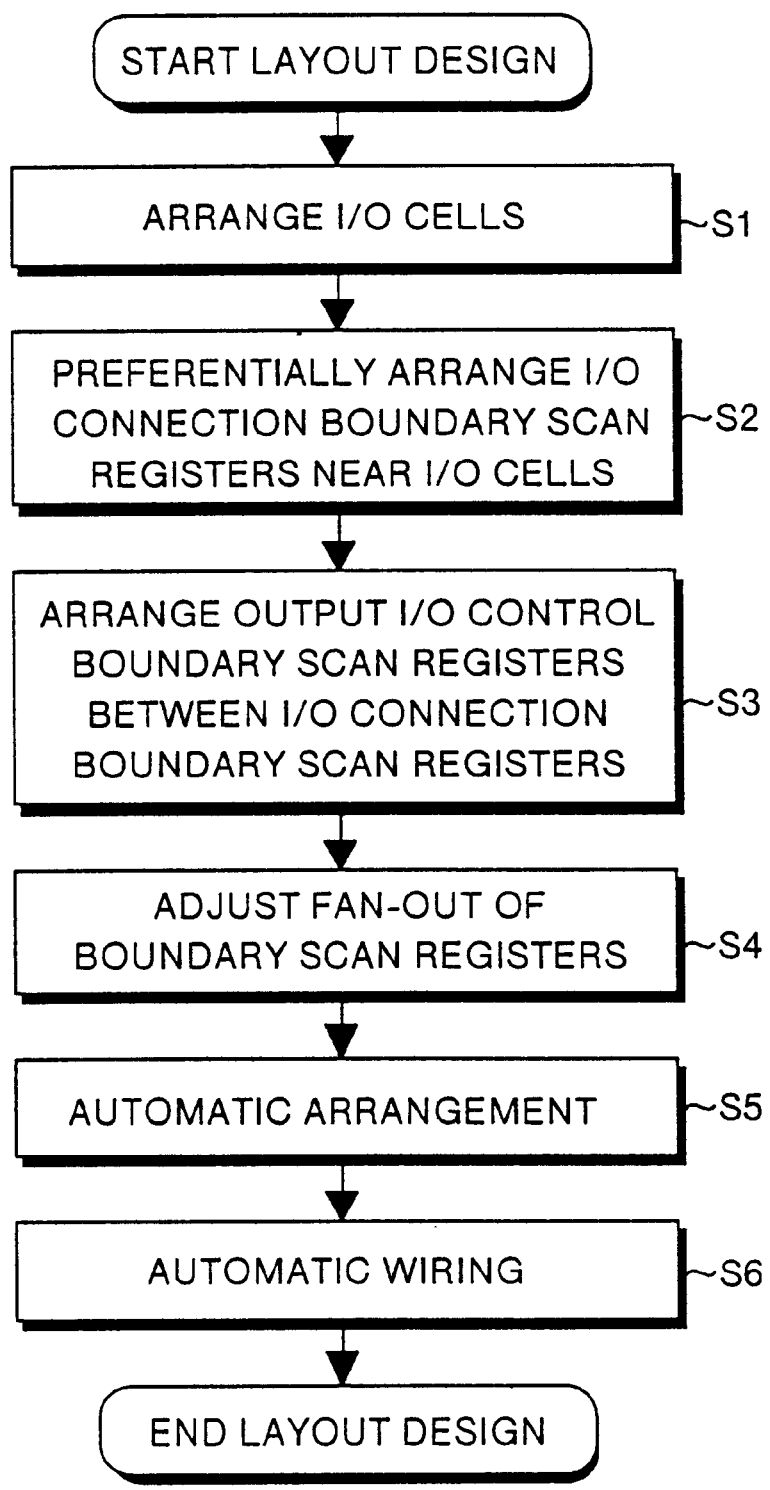
FIG. 2 is a flowchart showing procedures for an example of a method of designing a layout of an LSI chip according to the present invention.

Preferred embodiment of the present invention will be described hereinafter in detail with reference to the accompanying drawings. First, overall procedures for an example of a method of designing a layout of an LSI chip according to the present invention will be described. The method of designing of the layout:

FIG. 2 is a flowchart showing procedures for an example of an LSI chip design method according to the present invention. When designing of the layout of an LSI chip is started, I/O cells are arranged along the sides of a chip (in a step S1). Next, I/o connection boundary scan registers to be connected to the arranged I/O cells are arranged in empty regions in the vicinity of the connection target I/O cells, respectively (in a step S2). Next, a plurality of output I/O control boundary scan registers to be connected to the I/O connection boundary scan registers are arranged at the intermediate points between the connection target I/O connection boundary scan registers, respectively (in a step S3).

Figure 3:
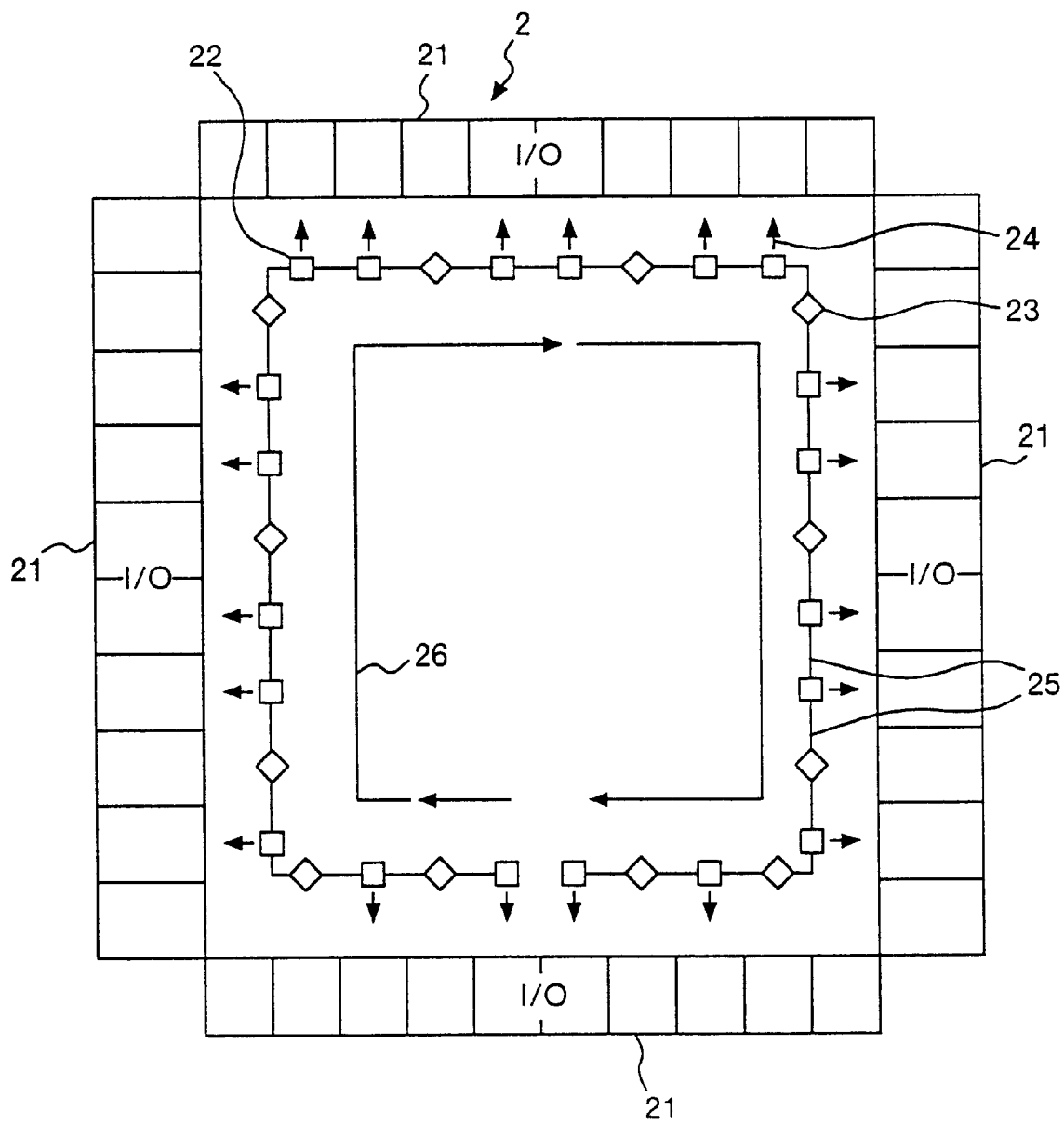
FIG. 3 is another typical view for describing the LSI chip layout design method according to the present invention.

Following the step S3, a fan-out adjustment is made to the boundary scan registers (in a step S4). Thereafter, the automatic arrangement of cells constituting other circuits such as an internal logic circuit is made (in a step S5) and automatic wiring is conducted (in a step S6), thus completing the layout design. Arrangement of I/O cells and boundary scan registers (steps S1 to S3):

FIG. 3 to FIG. 6 are typical views for describing the LSI chip layout design method according to the present invention. In FIG. 3, legend 2 denotes an overall LSI, legend 21 denotes an I/O region consisting of an I/O cell array, a hollow rectangle provided with legend 22 denotes an I/O connection boundary scan register connected to the I/O cell, and a hollow rhombi provided with legend 23 denotes an output I/O control boundary scan register connected to the I/O connection boundary scan register 22. Namely, FIG. 3 shows states in the steps S1 to S3 shown in FIG. 2.

In FIG. 3, arrows, provided with legend 24, between the I/O cells in the I/O region 21 and I/O connection boundary registers 22 denote nets between the I/O cells and the I/O connection boundary scan registers 22. Lines 25 coupling the respective boundary scan registers 22 and 23 denote test signal nets between the boundary scan registers. Marks, arrows and lines in FIG. 5 and FIG. 6 which follow, are indicated in the same manner as those in FIG. 3. In addition, in FIG. 3, a line 26 having large arrows indicated to circulate in the chip 2 denotes a test signal flow direction.

Here, arrangement positions are searched so as to determine the positions at which the I/O connection boundary scan registers are arranged, respectively. This search is intended to avoid the I/O cells to which the I/O connection boundary scan registers 22 are to be connected if power supply wirings and other I/O connection boundary scan registers 22 are already arranged in the vicinity of the I/O cells and to find arrangement positions closer to the next I/O cells to which the I/O connection boundary scan registers 22 are to be connected.

Figure 4:
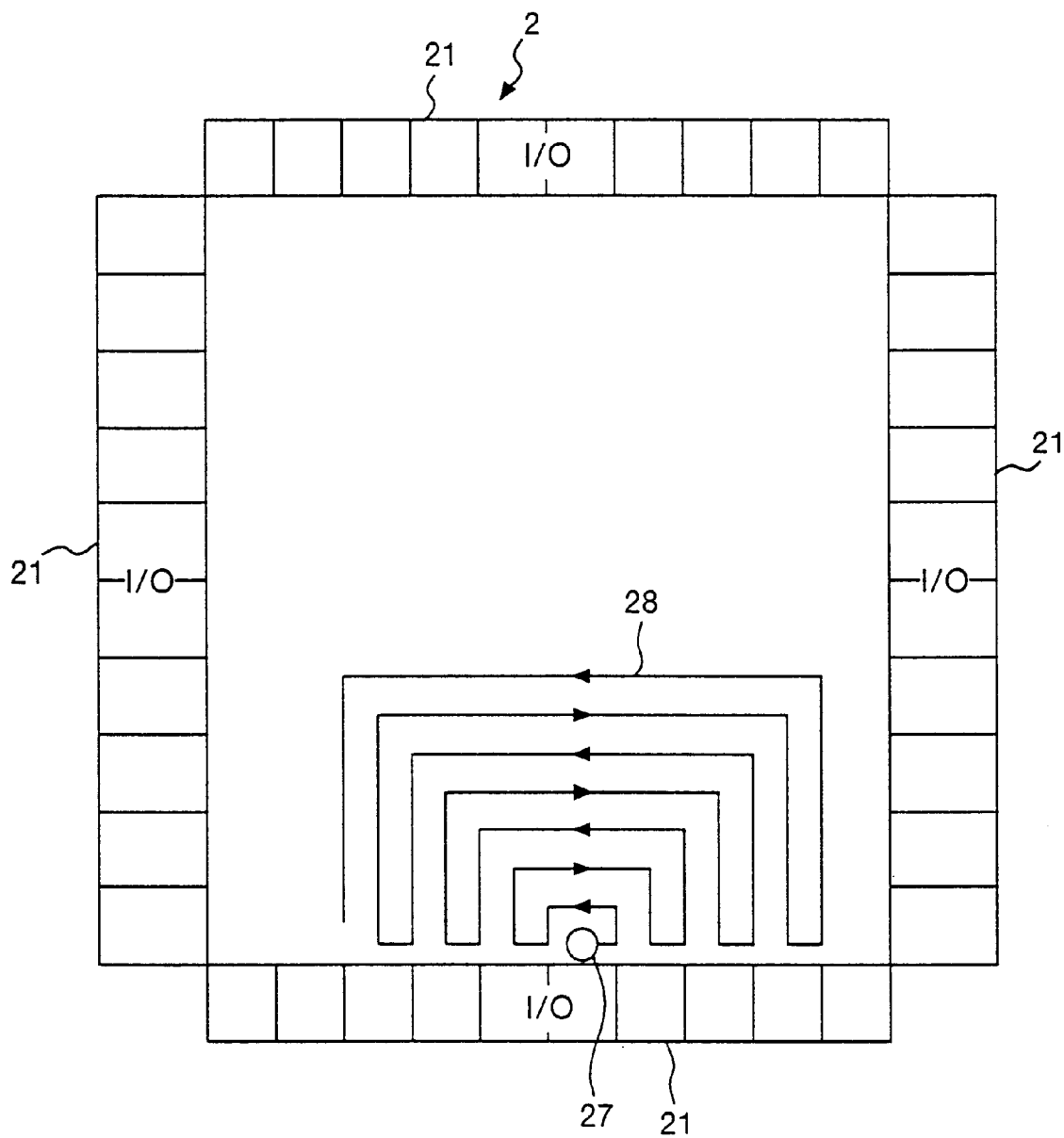
FIG. 4 is another typical view for describing the LSI chip layout design method according to the present invention.

To be specific, as shown in FIG. 4, the neighborhood of the connection target I/O cell is set as a search starting point (shown by a hollow circle) 27 and an empty region is searched toward the interior of the chip from the point 27 in a semicircular spiral manner as indicated by line 28 having arrows. This search method is also applied to a case of searching the arrangement positions of the output I/O control boundary scan registers 23. In the latter case, the intermediate point between the connection target I/O connection boundary scan registers 22 is set as the search starting point 27.

Figure 5:
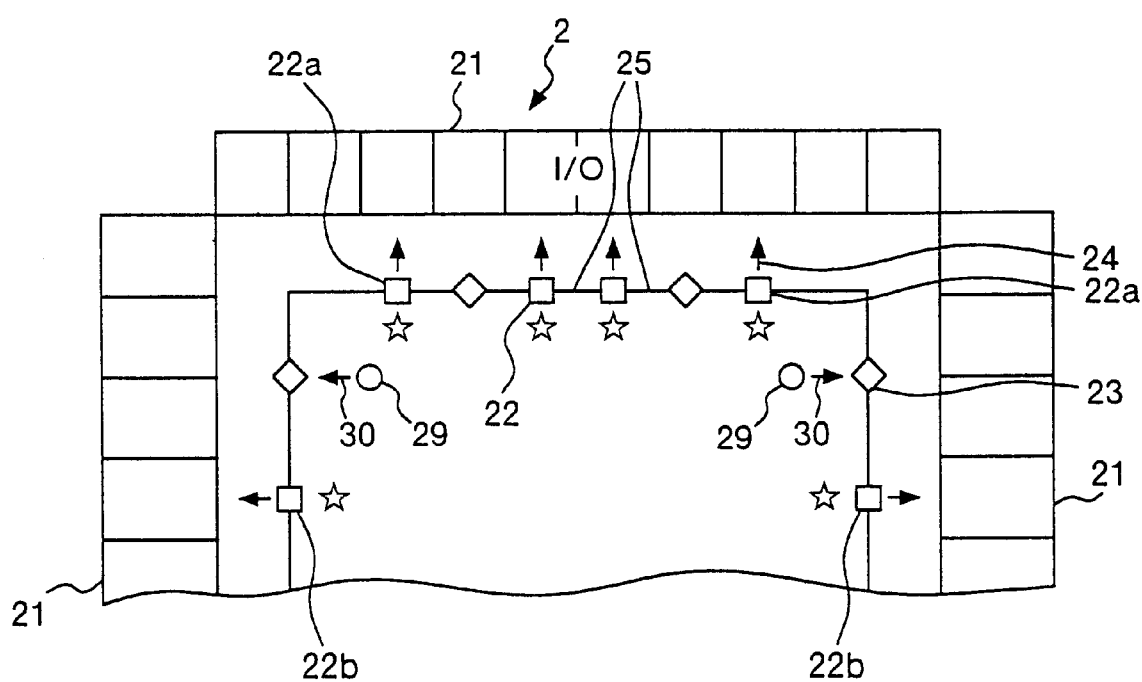
FIG. 5 is another typical view for describing the LSI chip layout design method according to the present invention.

Further, as shown in FIG. 5, if a plurality of I/O connection boundary scan registers 22a and 22b to which the output I/O control boundary scan register 23 is to be connected are arranged along different sides of the chip, an intermediate point (shown by a hollow circle) 29 between the registers 22a and 22b is located inside of the chip compared to the points at which the I/O connection boundary scan registers 22, 22a and 22b are arranged. In that case, the output I/O control boundary scan register 23 is arranged to be attracted to the chip side closer to the intermediate point 29 as indicated by an arrow 30 in FIG. 5. At this time, it is judged which of the chip sides is closer to the intermediate point 29 based on the coordinates. It is thereby possible to prevent the registers from hampering the arrangement of the internal logic circuit and the like by shifting the arrangement positions.

Figure 6:
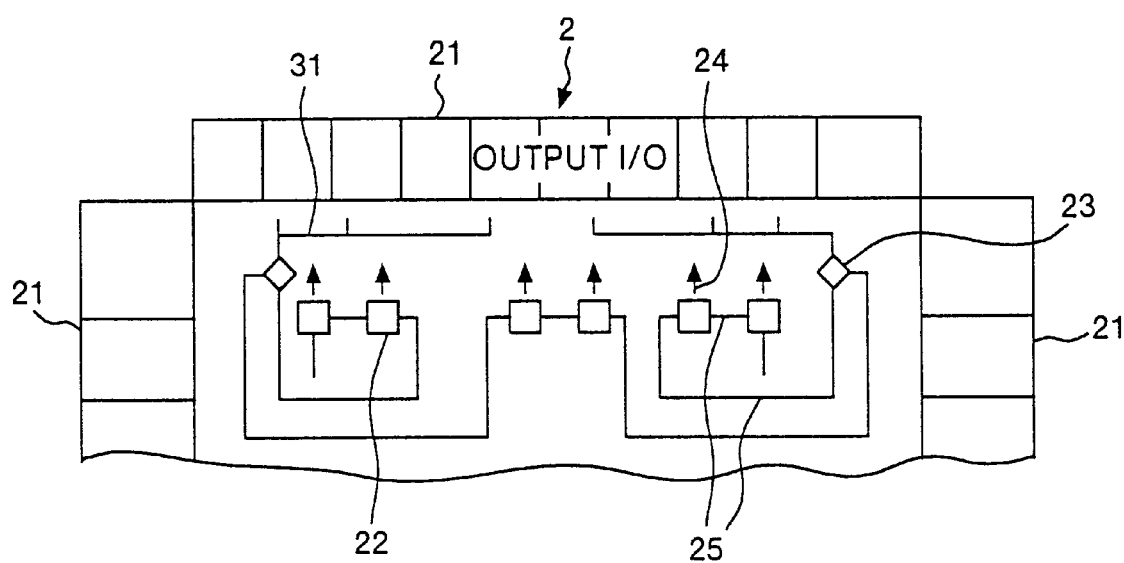
FIG. 6 is another typical view for describing the LSI chip layout design method according to the present invention.
Figure 7:
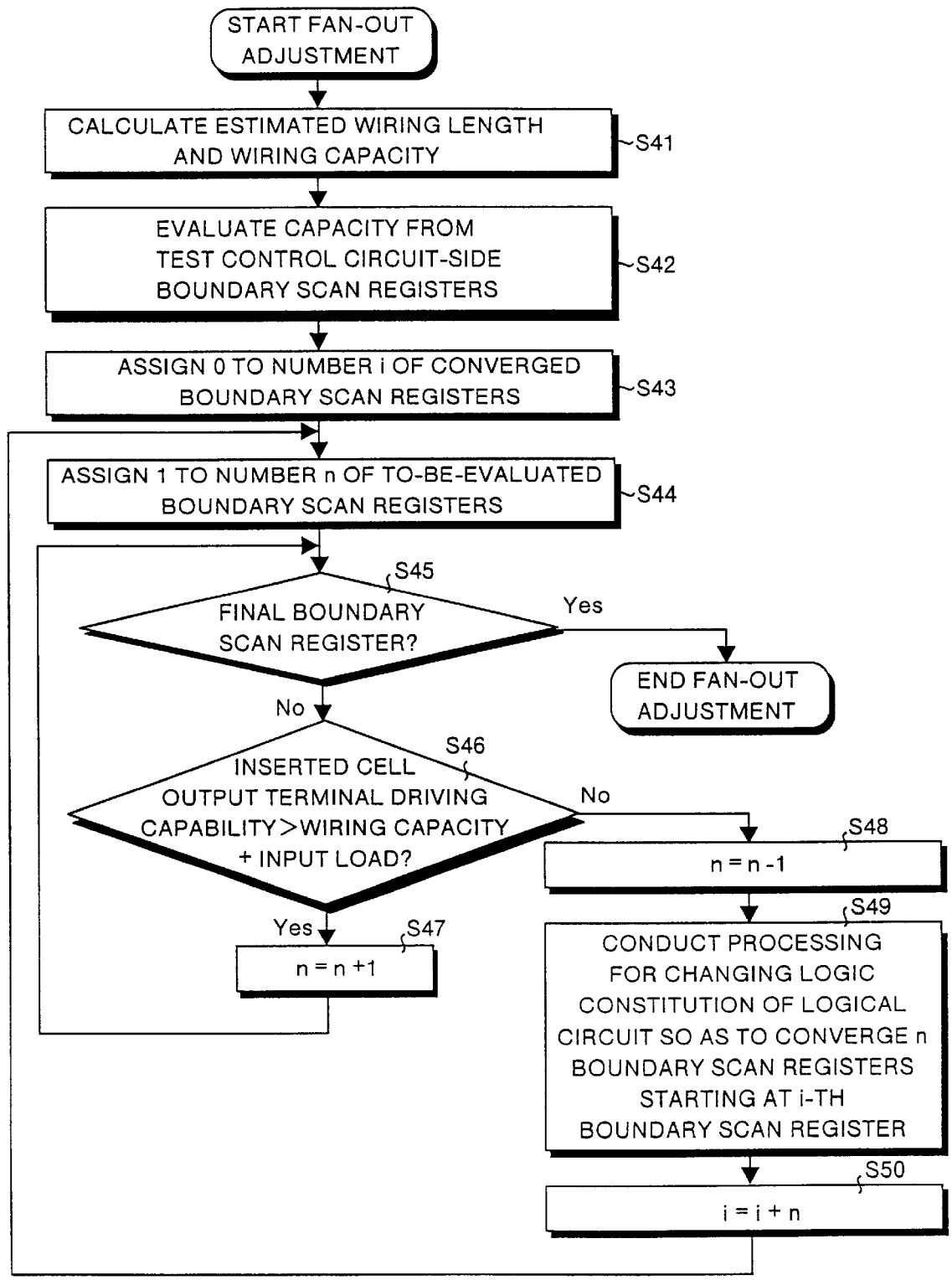
FIG. 7 is a flowchart showing procedures for an example of a fan-out adjustment method in the LSI chip layout design method according to the present invention.

If the output I/O control boundary scan register 23 is not arranged at the intermediate position of a plurality of I/O connection boundary scan registers 22, the arrangement of the register 23 becomes deviated as shown in FIG. 6. If so, the nets (denoted by legend 25 in FIG. 6) between the boundary scan registers are unfavorably, irregularly aligned in the direction in which test signals flow. It is noted that line 31 connecting each I/O cell of the I/O region 21 to each output I/O control boundary scan register 23 shown in FIG. 6 indicates an output I/O control net. Fan-out adjustment (step S4):

Next, the fan-out adjustment method in the step S4 will be described in detail. FIG. 7 is a flowchart showing procedures for an example of the fan-out adjustment method in the LSI chip layout design method according to the present invention.

In the flowchart of FIG. 7, tentative wiring lengths and estimated wiring capacities are calculated first (in a step S41). Namely, wiring lengths between the arranged boundary scan registers are estimated and wiring capacities are estimated based on the tentative wiring lengths. The specific method thereof will be described later with reference to FIG. 8.

Following the step S41, the capacities of the test control circuit-side boundary scan registers are evaluated (in a step S42). Zero (0) is set (assigned) to the number i of converged boundary scan registers (in a step S43). Here, the number i also means the order of a series of the boundary scan registers connected from the test control circuit side. Then, 1 is set (assigned) to the number n of evaluated boundary scan registers (in a step S44). Next, it is determined whether or not a final boundary scan register is evaluated (in a step S45) and it is then determined whether or not the following equation (1) is satisfied (in a step S46):

$$[Drv] \times [ratio] \times \alpha > [NetC] + [BsrL] + [BufL] \quad (1).$$

In the equation (1), 'Drv' is the output terminal driving capability of a cell to be inserted, 'ratio' is a load tolerance with respect to the driving capability, '$\alpha$' is a correction coefficient set in view of the difference between the tentative wiring length and an actual wiring length and is a numeric value greater than 0 and not greater than 1. In addition, 'NetC' is the sum of the wiring capacities of (i+1)-th to (i+n)-th boundary scan registers on the test control circuit side in this order, 'BsrL' is the sum of the input loads of (i+1)-th to (i+n)-th boundary scan registers on the test control circuit side in this order, and 'BufL' is the sum of the input loads of inserted buffers cells in the next stage.

The reason why the correction coefficient $\alpha$ is used is as follows. The tentative wiring length is obtained by obtaining the shortest path thereof based on the arrangement coordinate of each boundary scan register. The actual wiring, by contrast, sometimes takes a detour because of the influence of jammed cells and wiring prohibited regions and the length thereof is, therefore, larger than the tentative wiring length. To correct the estimated length and to make a fan-out adjustment while the estimated length is made closer to the actual wiring length, the correction coefficient $\alpha$ is required.

The correction coefficient $\alpha$ is obtained by obtaining the difference between the actual wiring length, for example, on a plurality of types of existing LSI chips and the tentative wiring length based on the Manhattan length stated above, analyzing the difference and thereby finding out that there is a certain numeric tendency. The concrete method thereof will be described later with reference to FIG. 9.

Next, if the equation (1) is satisfied in the step S46 ('Yes' in the step S46), n is incremented by 1 (in a step S47) and the next boundary scan register is added to the estimated boundary scan register group. Then, the step S45 follows, in which step if the final boundary scan register is included in the estimated register group ('Yes' in the step S45), the fan-out adjustment is ended. Therefore, the processing in the step S5 shown in FIG. 2 follows.

On the other hand, if the final boundary scan register is not included in the estimated register group ('No' in the step S45), the step S46 follows. In the step S46, if the equation (1) is satisfied ('Yes' in the step S46), n is incremented by 1 again (in a step S47) and the step S45 follows. In the step S45, the next boundary scan register is added to the estimated register group.

If the equation (1) stated above is not satisfied ('No' in the step S46), it follows that the boundary scan registers up to the register in front of this boundary scan register have been converged. Therefore, n is decremented by 1 and the number of converged boundary scan registers is reduced by one (in a step S48). The logical constitution of the logic circuit is changed so that n boundary scan registers starting at the i-th register are converged (in a step S49), and (i+n) is assigned to i (in a step S50), followed by the step S44. Thereafter, the same processings (processings in the steps S44 to S50) are repeated since the final boundary scan register is included in the step S45 until the fan-out adjustment is ended.

Figure 8:
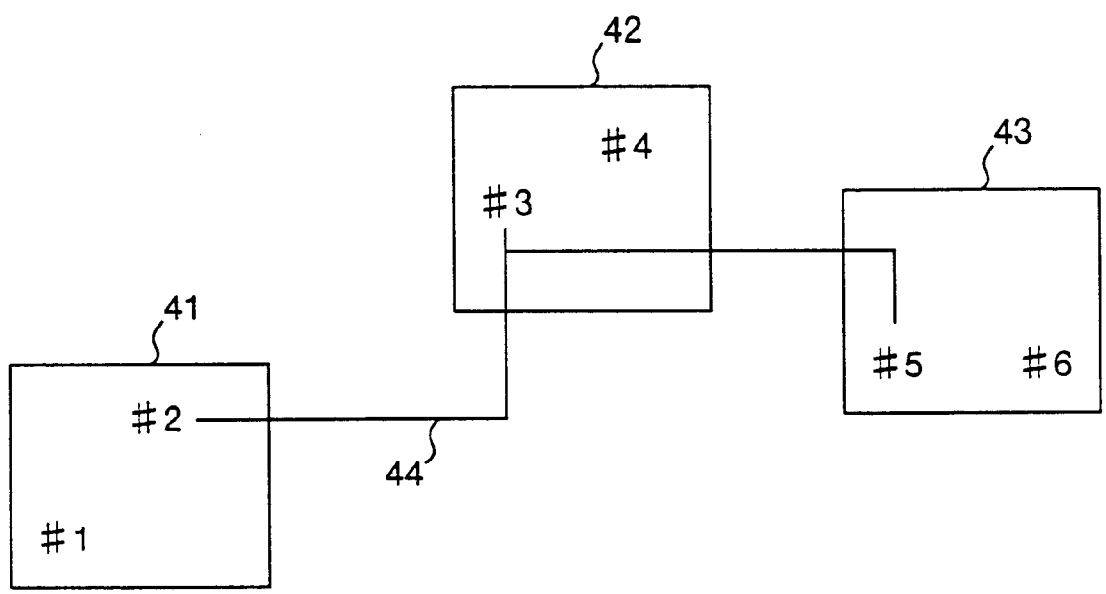
FIG. 8 is a typical view for describing the fan-out adjustment method (step S41) in the LSI chip layout design method according to the present invention.

FIG. 8 is a typical view for describing the fan-out adjustment method in the LSI chip layout design method according to the present invention. In the step S41 in the flowchart of FIG. 7, if the wiring lengths between the boundary scan registers thus arranged are estimated and the wiring capacities are estimated based on the tentative wiring lengths, a combination of shortest lengths is selected based on the wiring coordinates of, for example, adjacent boundary scan registers 41, 42 and 43, and Manhattan lengths at that time are set as tentative wiring lengths. In FIG. 8, #1 to #6 denote the terminals of the scan registers and line 44 coupling the terminals #2, #3 and #5 denote an estimated wiring path.

Figure 9:
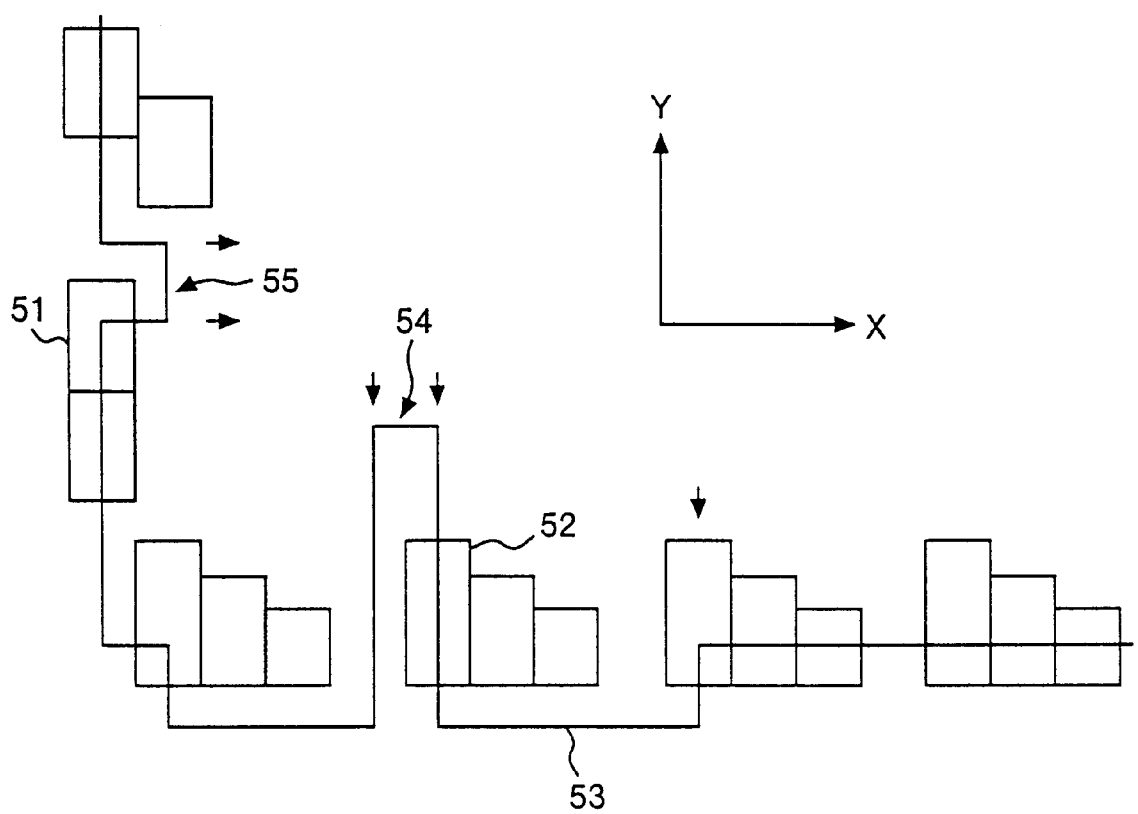
FIG. 9 is a typical view for describing the fan-out adjustment method (step S46) in the LSI chip layout design method according to the present invention.

FIG. 9 is a typical view for describing the fan-out adjustment method in the LSI chip layout design method according to the present invention. As already stated above, in the step S46, the correction coefficient $\alpha$ is obtained by obtaining the difference between the actual wiring length and the tentative wiring length based on the above-stated Manhattan length on, for example, a plurality of types of existing LSI chips, analyzing the difference and finding out that there is a certain numerical tendency. In that case, a case where a wiring 53 is detoured, for example, in the longitudinal direction of the portrait boundary scan registers 51 and 52 as shown in FIG. 9 (a portion indicated by legend 54 in FIG. 9) and a case where the wiring 53 is detoured in the horizontal direction (a portion indicated by legend 55) differs in the length of the wiring portion (which is an arrow portion in FIG. 9) which is not included in the tentative wiring length. The same thing is true for a case where the boundary scan registers are oblong.

Accordingly, a correction coefficient $\beta$ in a case where the wiring is detoured longitudinally and a correction coefficient $\gamma$ in a case where the wiring is detoured horizontally are set and the entire correction coefficient $\alpha$ is obtained by the following equation (2) using the two correction coefficients $\beta$ and $\gamma$:

$$\alpha = (Nh/(Nh+Nv)) \times \gamma + (Nv/(Nh+Nv)) \times \beta \quad (2).$$

In the equation (2), Nh is the number of boundary scan registers aligned in the horizontal direction (lateral direction, X direction) and Nv is the number of boundary scan registers aligned in the vertical direction (longitudinal direction, Y direction). As for the directions in which the boundary scan registers are aligned, if the X direction length is larger than the Y direction length (X direction length>Y direction length) with respect to the distance between the two boundary scan registers, it is judged that the direction is horizontal. If the Y direction length is larger than the X direction length (Y direction length>X direction length), it is judged that the direction is vertical.

Figure 10:
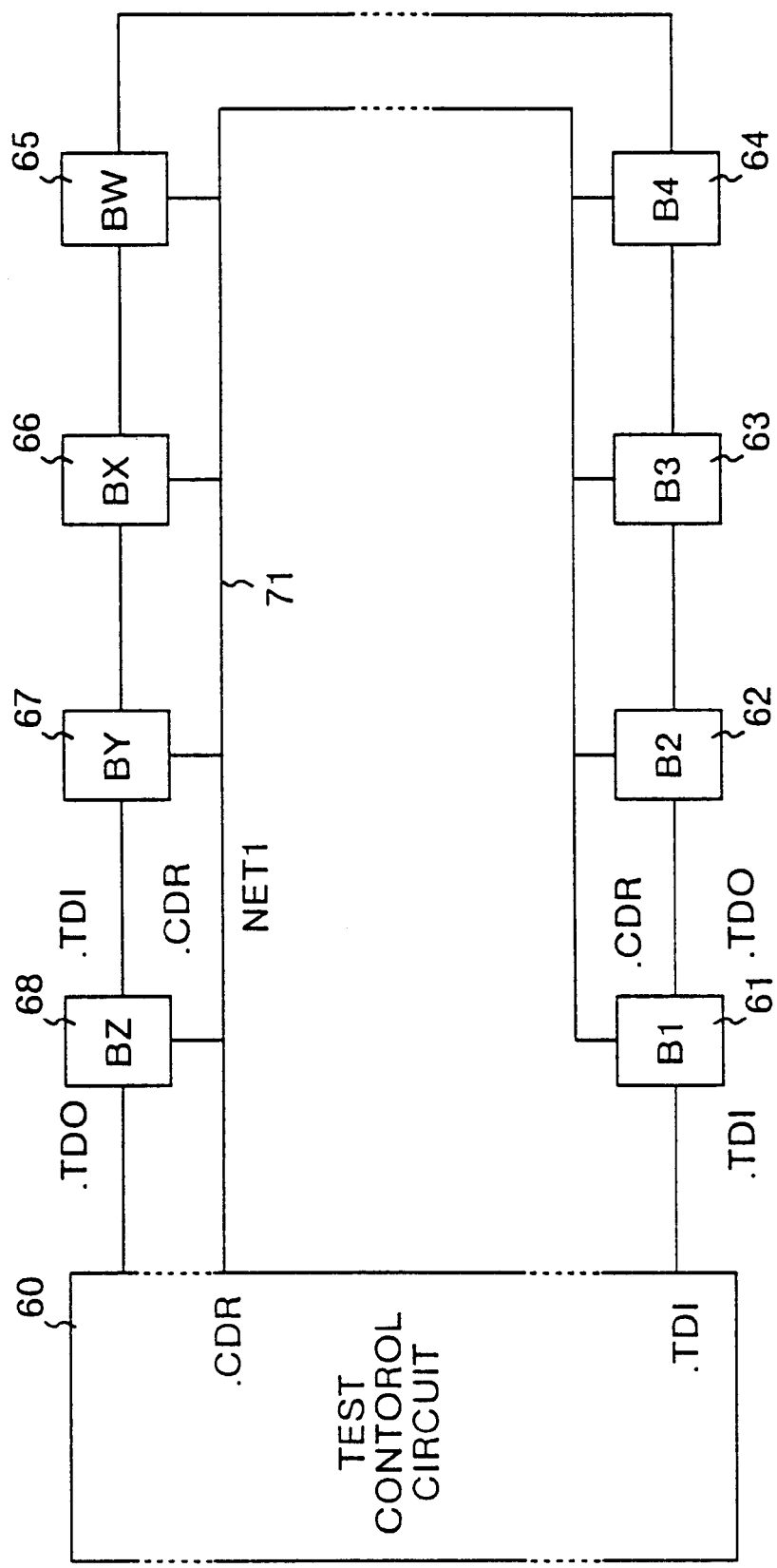
FIG. 10 is an explanatory view showing nets between boundary scan registers and the nets of test signals to the boundary scan registers before fan-out adjustment.
Figure 11:
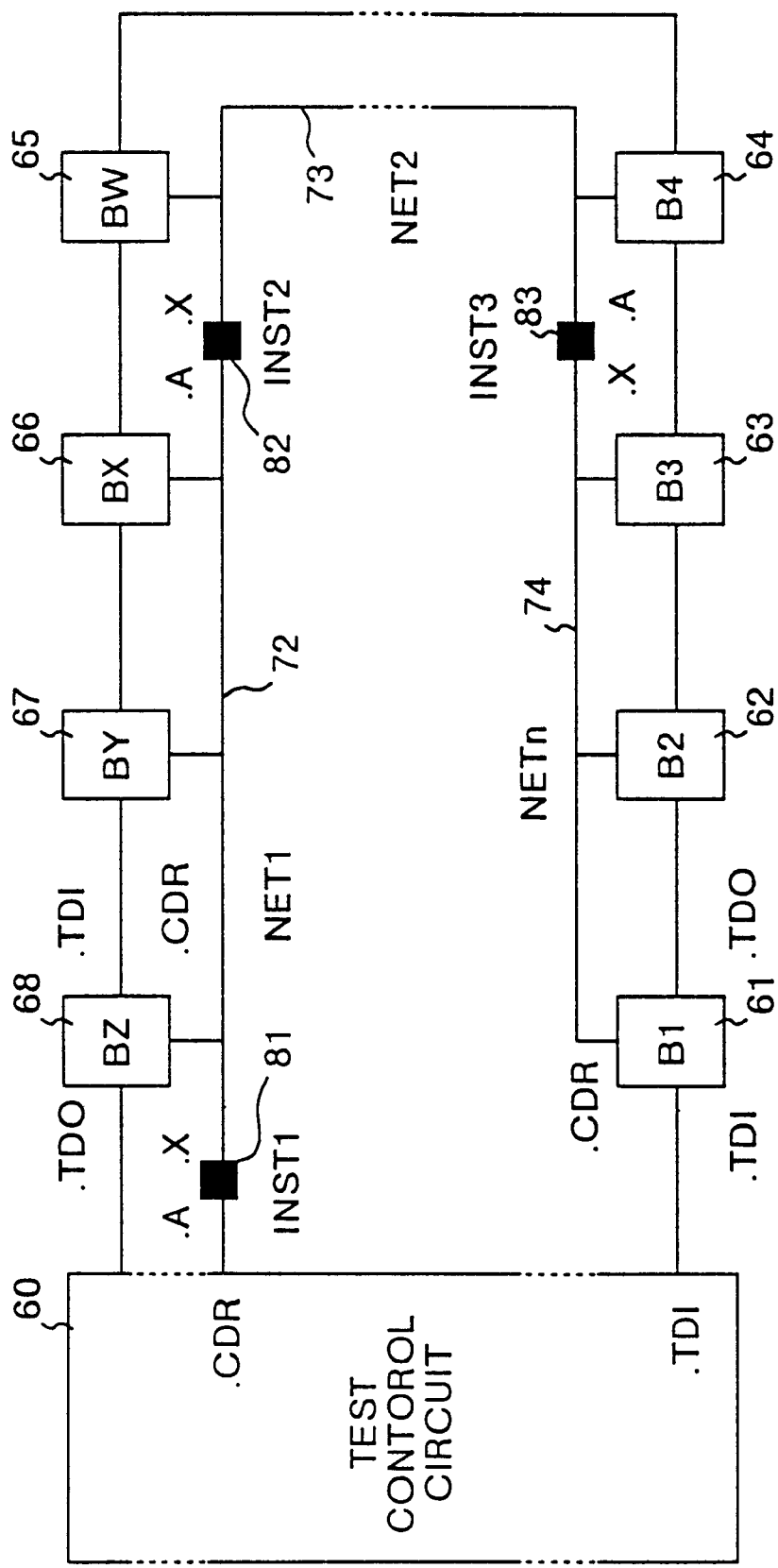
FIG. 11 is an explanatory view showing nets between boundary scan registers and the nets of test signals to the boundary scan registers after fan-out adjustment.

FIG. 10 is an explanatory view showing the nets between the boundary scan registers and those of test signals to the boundary scan registers after arranging the boundary scan registers and before the fan-out adjustment is made. FIG. 11 is an explanatory view showing the nets between the boundary scan registers and those of test signals to the boundary scan registers after the fan-out adjustment is made.

In FIG. 10 and FIG. 11, legend CDR denotes the capture clock terminal of a data register, legend TDI denotes a serial test data input terminal, legend TDO denotes a serial test data output terminal, and legends .A and .X denote the input terminal and output terminal of a buffer cell, respectively.

In FIG. 10 and FIG. 11, B1 to BZ with legends 61 to 68 denote boundary scan registers, respectively. These boundary scan registers 61 to 68 are connected to the test control circuit 60 in a chain direction from B1 to BZ.

As shown in FIG. 10, before a fan-out adjustment is made, the capture clock (.CDR) terminals of all the boundary scan registers 61 to 68 belong to one net (NET1) 71. This net 71 is connected to the capture clock (.CDR) terminal of the data register of the test control circuit 60. After the fan-out adjustment, nets connected to the respective capture clock terminals of the boundary scan registers 61 to 68 are divided into a plurality of nets (NET1, NET2, NETn) 72, 73 and 74 by a plurality of buffer cells (INST1, INST2, INST3) 81, 82 and 83 respectively inserted into the optimum positions in the nets as shown in FIG. 11.

In the example shown in FIG. 11, the first buffer cell (INST1) 81 drives the capture clock terminals of the BZ, BY and BX boundary scan registers 68, 67 and 68 belonging to the first net (NET1) 72. The first buffer cell (INST1) 81 is inserted in the vicinity of the BZ boundary scan register 68 arranged at the rearmost end of the boundary scan register chain.

In addition, the second buffer cell (INST2) 82 drives the capture clock terminals of BW and B4 boundary scan registers 65 and 64 belonging to the second net (NET2) 73. The second buffer cell (INST2) 82 is inserted in the vicinity of BW boundary scan register 65 closest to the test control circuit 60 among the boundary scan registers to be driven.

Likewise, the third buffer cell (INST3) 83 drives the capture clock terminals of B3, B2 and B1 boundary scan registers 63, 62 and 61 belonging to the n-th net (NETn) 74. The third buffer cell (INST3) 83 is inserted in the vicinity of B3 boundary scan register 63 closest to the test control circuit 60 among the boundary scan registers to be driven. These first to third buffer cells (INST1, INST2 and INST3) 81, 82 and 83 are inserted from the rearmost side of the boundary scan registers chain in this order.

Figure 12:
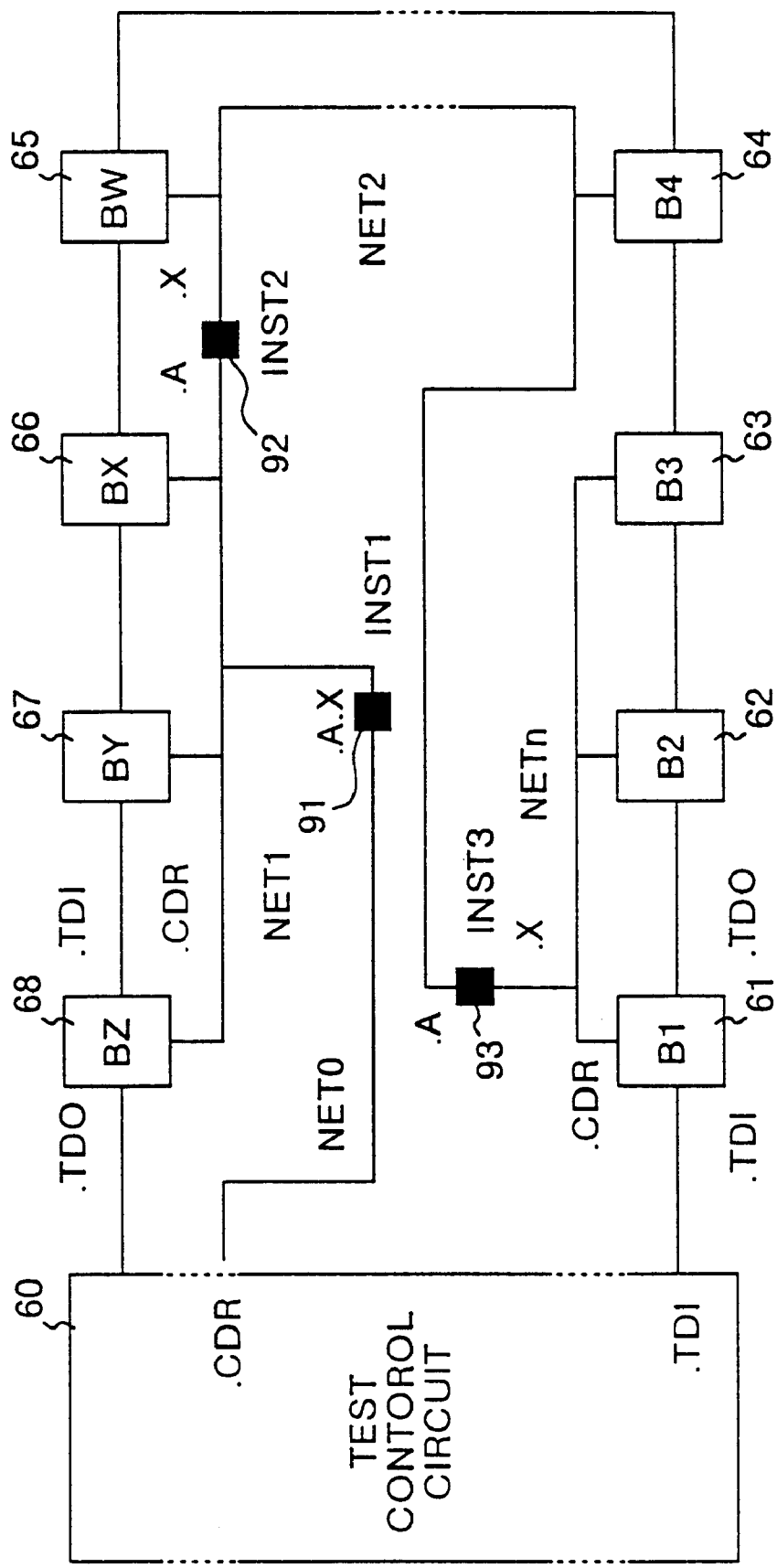
FIG. 12 is an explanatory view showing nets between boundary scan registers and the nets of test signals to the boundary scan registers while buffer cells are not arranged at optimum positions.

For comparison sake, FIG. 12 shows the nets between the boundary scan registers and the nets of test signals to the boundary scan registers while buffer cells are not arranged at the optimum positions. In FIG. 12, the arrangement positions of a plurality of buffer cells (INST1, INST2, INST3) 91, 92 and 93 are not such optimum positions as described with reference to FIG. 11, i.e., not in the vicinity of the boundary scan registers closest to the test control circuit 60 among the boundary scan register chain to be driven. Due to this, long wirings are required on the nets to thereby undesirably cause over-capacity and timing errors.

A program for allowing a computer to execute the above-described layout design method is recorded on a computer readable recording medium and realized by a computer-aided design device (to be referred to as "CAD device" hereinafter). This program is recorded on a computer readable recording medium such as a hard disk, a floppy disk, a CD-ROM, an MO or a DVD and executed after being read from the recording medium by a computer. Also, this program can be distributed as a transmission medium or through the above-stated recording medium and a network such as the Internet.

Figure 13:
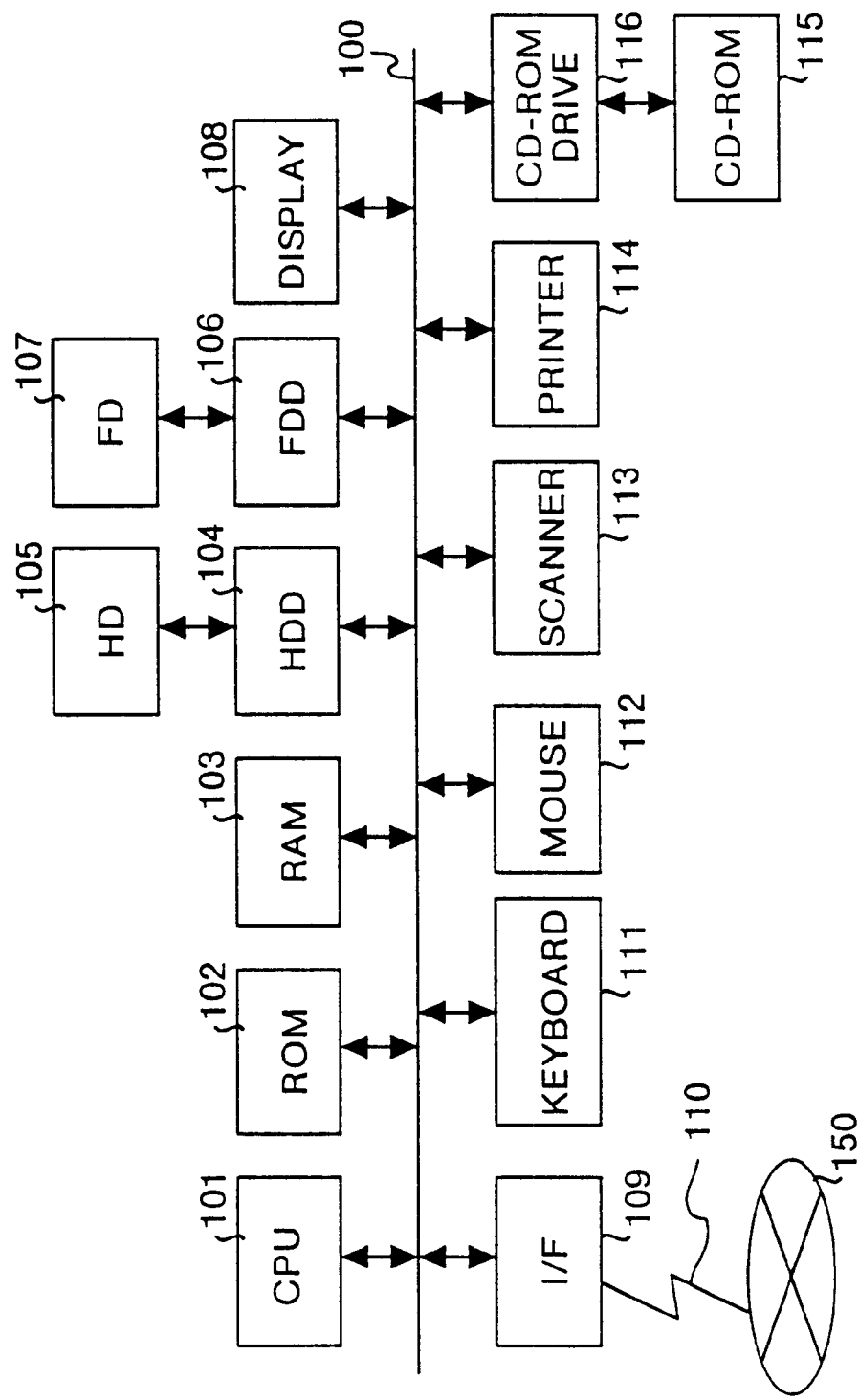
FIG. 13 is a block diagram showing the constitution of a CAD device used to work the LSI chip layout design method according to the present invention.

Constitution of CAD device:

FIG. 13 is a block diagram showing the constitution of an example of a CAD device used to implement the method according to this invention. This CAD device is constituted, for example, such that a CPU 101, an ROM 102, an RAM 103, an HDD (hard disk drive) 104, an FDD (floppy disk drive) 106, a display 108, a communication interface (I/F) 109, a keyboard 111, a mouse and the like (including various pointing devices) 112, a scanner 113, a printer 114 and a CD-ROM drive 116 are mutually connected through a bus 100.

The program for allowing a computer to execute the above-stated layout design method is recorded on the FD 107 or the CD-ROM 115. In addition, the program recorded on the FD 107 or the CD-ROM 115 is stored in an HD 105 and then executed by the HD 105.

The CPU 101 entirely controls the CAD device. The ROM 102 stores a boot program and the like. The RAM 103 is used as the work area of the CPU 101. The HDD (hard disk drive) 105 controls the HD (hard disk) 105 to write and read data under the control of the CPU 101. The FDD (floppy disk drive) 106 controls the FD (floppy disk) 107 which is a detachable recording medium to write and read data under the control of the CPU 101.

The display 108 displays windows (browsers) relating to data such as documents, images and functional information as well as cursors, icons and a tool box. The communication interface (I/F) 109 is connected to a network 150 through a wire or radio communication line 110 and serves as an interface between the network 150 and the interior of the device.

The keyboard 111 is provided with a plurality of keys for inputting characters, numeric values, various instructions and the like. The mouse and the like 112 are used to move the cursors, select the range of the cursors, move the windows or change the sizes of the windows, select and move the icons or the like. The scanner 113 is a device for optically reading images. The printer 114 prints the contents displayed on the windows or the like. The CD-ROM drive 116 controls the CD-ROM 115 which is a detachable recording medium, to read data.

According to this embodiment, after arranging the I/O cells, the I/O connection boundary scan registers 22 are preferentially arranged, the output I/O control boundary scan registers 23 are arranged based on the arrangement of the I/O connection boundary scan registers 22, the wiring lengths between the respective boundary scan registers are estimated and then a fan-out adjustment is made. It is, therefore, possible to automatically arrange the boundary scan registers 22 and 23 in the vicinity of the I/O cells along the arrangement of the I/O cells and to realize the fan-out adjustment by inserting a minimum number of buffer cells 81, 82 and 83.

By doing so, it is possible to eliminate the crossing of the nets of test signal to the boundary scan registers and, therefore, to prevent operation failure caused by the backflow of the test signals or the like from occurring. Furthermore, since the number of inserted buffer cells can be suppressed from increasing, it is possible to avoid the disadvantage of the increase of the LSI area and the increase of wiring jam. Besides, since there is no need to manually arrange the boundary scan registers and to manually make a fan-out adjustment, man-hour for LSI development can be greatly reduced.

For instance, according to this embodiment, the number of inserted buffer cells is by about a factor of tens or several tens of the number of inserted buffer cells in a case where a fan-out adjustment is made using a conventional, commercially available test circuit synthetic tool. As a result of the verification of a certain LSI made by the inventors of the present invention, the number of inserted buffer cells was 370 if a conventional tool was used while the number of inserted buffer cells according to this embodiment was 29, and no over-capacity or timing errors after providing wirings were found.

The present invention stated so far should not be limited to the above-mentioned embodiment and the illustration of the drawings. Various modifications and changes can be made to the content of the invention within the scope of the invention.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of designing a layout of an LSI chip having boundary scan registers, the method comprising:
   arranging I/O cells;
   arranging I/O connection boundary scan registers to be connected to the I/O cells, in empty regions near connection target I/O cells among a group of the arranged I/O cells and along a scan chain that represents an order of scanning;
   arranging output I/O control boundary scan registers adjacent to an edge of the LSI chip and along the scan chain, the output I/O control boundary scan registers to be connected to the I/O connection boundary scan registers, based on arrangement positions of a plurality of connection target I/O connection boundary scan registers among a group of the arranged I/O connection boundary scan registers;
   making a fan-out adjustment to the arranged I/O connection boundary scan registers and output I/O control boundary scan registers;
   arranging cells constituting other circuits in empty regions; and
   creating a wiring pattern.

2. The method of designing a layout of an LSI chip according to claim 1, wherein
   the output I/O control boundary scan registers are arranged at intermediate points between a plurality of connection target I/O connection boundary scan registers along the chain, respectively.

3. The method of designing a layout of an LSI chip according to claim 1, wherein
   if a plurality of I/O connection boundary scan registers to which the output I/O control boundary scan registers are connected, are arranged along a pair of adjacent chip sides, the output I/O control boundary scan registers are arranged toward the chip side closer to intermediate points between the plurality of connection target I/O connection boundary scan registers out of the pair of chip sides.

4. The method of designing a layout of an LSI chip according to claim 1, wherein
   the fan-out adjustment is made by calculating a tentative wiring length between the boundary scan registers arranged adjacent each other based on Manhattan lengths of the boundary scan registers, calculating an estimated wiring capacity based on the tentative wiring length, and inserting buffer cells into test signal nets based on the estimated wiring capacity, so that loads of input terminals of the boundary scan registers driven by the buffer cells, fall within a range of driving capabilities of output terminals of the buffer cells.

5. The method of designing a layout of an LSI chip according to claim 4, wherein
   a correction coefficient for correcting a difference between the tentative wiring length and an actual wiring length is obtained in advance, and the driving capabilities of the output terminals of the buffer cells are corrected using the correction coefficient.

6. The method of designing a layout of an LSI chip according to claim 4, wherein
   each of the buffer cells is arranged near the boundary scan register closest to a test control circuit among one or a plurality of boundary scan registers driven by the buffer cells.

7. A computer readable medium for storing instructions, which when executed on a computer, causes the computer to perform design layout of an LSI chip to execute:
   arranging I/O cells;
   arranging I/O connection boundary scan registers to be connected to the I/O cells, in empty regions near the connection target I/O cells among a group of the arranged I/O cells and along a scan chain that represents an order of scanning;
   arranging output I/O control boundary scan registers adjacent to an edge of the LSI chip and along the scan chain, the output I/O control boundary scan registers to be connected to the I/O connection boundary scan registers, based on arrangement positions of a plurality of corresponding connection target I/O connection boundary scan registers among a group of the arranged I/O connection boundary scan registers;
   making a fan-out adjustment to the arranged I/O connection boundary scan registers and output I/O control boundary scan registers;
   arranging cells constituting other circuits in empty regions; and
   creating a wiring pattern.

8. A computer readable recording medium according to claim 7, wherein
   the computer program allows the computer to make the fan-out adjustment by calculating a tentative wiring length between the boundary scan registers arranged adjacent each other based on Manhattan lengths of the boundary scan registers, calculating an estimated wiring capacity based on the tentative wiring length, and inserting buffer cells into test signal nets based on the estimated wiring capacity so that loads of input terminals of the boundary scan registers driven by the buffer cells fall within a range of driving capabilities of output terminals of the buffer cells.

9. A method of designing a layout of an LSI chip, comprising:

arranging I/O cells;

arranging I/O connection boundary scan registers to be connected to the I/O cells, in empty regions near selected ones of the arranged I/O cells and along a scan chain that represents an order of scanning;

arranging output I/O control boundary scan registers adjacent to an edge of the LSI chip and along the scan chain, the output I/O control boundary scan registers to be connected to the I/O connection boundary scan registers;

making a fan-out adjustment to the arranged I/O connection boundary scan registers and output I/O control boundary scan registers;

arranging cells constituting additional circuits in empty regions; and creating the wiring pattern.

10. A method as set forth in claim 9, further comprising arranging the output I/O control boundary scan registers toward a chip side closer to intermediate points between selected ones of the I/O connection boundary scan registers, if a plurality of the I/O connection boundary scan registers to which the output I/O control boundary scan registers are connected, are arranged along a pair of adjacent chip sides.

* * * * *